(12) United States Patent  (10) Patent No.: US 7,524,432 B2
Momose et al.  (45) Date of Patent: Apr. 28, 2009

(54) METAL PATTERN FORMING METHOD

(75) Inventors: Shinya Momose, Matsumoto (JP); Kazushige Hakeda, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/686,834

(22) Filed: Mar. 15, 2007

(65) Prior Publication Data

US 2007/0218695 A1 Sep. 20, 2007

(30) Foreign Application Priority Data

Mar. 17, 2006 (JP) ............................. 2006-075484

(51) Int. Cl.
*H01L 21/302* (2006.01)
(52) U.S. Cl. .................. 216/83; 216/47; 430/313; 430/291; 430/314; 430/325; 430/335
(58) Field of Classification Search ................ 216/83, 216/49; 430/331, 314, 291, 270, 335, 325
See application file for complete search history.

(56) References Cited

U.S. PATENT DOCUMENTS

| | | | | |
|---|---|---|---|---|
| 4,012,276 A | * | 3/1977 | Schertler | 156/558 |
| 4,389,281 A | * | 6/1983 | Anantha et al. | 438/736 |
| 4,957,583 A | * | 9/1990 | Buck et al. | 156/345.11 |
| 5,175,078 A | * | 12/1992 | Aoyama et al. | 430/331 |
| 6,514,887 B1 | * | 2/2003 | Willis et al. | 442/82 |

FOREIGN PATENT DOCUMENTS

| | | | |
|---|---|---|---|
| JP | 07104473 A | * | 4/1995 |
| JP | 2003-109949 | | 4/2003 |
| JP | 2003-229420 | | 8/2003 |
| KR | 2002-0071987 | * | 12/2002 |

OTHER PUBLICATIONS

Swenson (Ask a scientist; chemistry archive; Aug. 31, 2004; http://www.newton.dep.anl.gov/askasci/chem03/chem03370.htm).*
MSDS: Nitric Acid (1997).*
Raghavan (Wet Etching and Cleaning: Surface Considerations and Process Issues); Dept. of Chemical and Environmental Engineering, University of Arizona; 1999 Arizona Board of Regents for the University of Arizona.*

* cited by examiner

*Primary Examiner*—Keith D Hendricks
*Assistant Examiner*—Patricia A George
(74) *Attorney, Agent, or Firm*—Workman Nydegger

(57) ABSTRACT

A method of forming a metal pattern comprising forming a metal film having a lower layer made of a metal and an upper layer made of a metal different from the metal of the lower layer, forming a resist film having a predetermined pattern on the upper layer, and patterning the metal film by etching the metal film using the resist film as a mask. Here, patterning the metal film comprises etching the upper layer, immersing the resist film and the upper layer in a pretreatment liquid containing a nonionic surfactant after the first etching process, and etching the lower layer after the immersing process.

12 Claims, 1 Drawing Sheet

METAL PATTERN FORMING METHOD

The entire disclosure of Japanese Patent Application No. 2006-75484, filed Mar. 17, 2006 is incorporated by reference herein.

BACKGROUND

1. Technical Field

The present invention relates to a method of forming a metal pattern. More specifically, the present invention relates to a method of forming a metal pattern including a plurality of metal layers.

2. Related Art

Wires of ICs and LSICs or liquid crystal displays are generally created by forming a metal film on a substrate and etching the metal film into a predetermined metal pattern using a resist film patterned by a photolithography method. For example, when a gold (Au) wire is formed, a close adhesion layer made of Nichrome (NiCr) is generally placed between the substrate and the Au layer so as to create a close adhesion between the Au layer and the substrate. When a wire formed of a metal pattern including an NiCr layer and an Au layer is formed, the NiCr layer and the Au layer are also etched using a resist film. Often, however, the etching liquid also reaches the side surfaces of the NiCr and Au layer that are not masked by the resist film acting and side etching occurs when the etchant undercuts the resist film. Thus, side etching may reduce the width of the NiCr layer and the Au layer more than the width of the etching mask, causing the side surfaces of the wire to become tapered. In addition, other difficulties arise when the resist film is peeled off from the metal film during the etching process, causing additional incidences of side etching. Thus, it is often difficult to obtain a wire having a desired width using the etching process.

In order to suppress side etching, it has been attempted to improve the etchant itself by adjusting the concentration of the etchant and the like. A technique of controlling an etching speed of gold or similar metal by performing an etching process using as an etchant an aqueous solution containing iodine and a compound (surfactant) having at least one alcoholic hydroxyl group in a side chain thereof has been disclosed (see JP-A-2003-229420 and JP-A-2003-109949). However, these attempts to improve the etchant generally result in poorer etching performance than found with traditional etchants.

Thus it is difficult to obtain a metal pattern having a desired width which includes a plurality of metal layers.

BRIEF SUMMARY OF THE INVENTION

The present invention attempts to solve the above-mentioned problems. One object of the invention is to provide a method of forming a metal pattern with a uniform, desired width by suppressing the effects of side etching.

One aspect of the invention is a method of forming a metal pattern comprised of forming a metal film with a lower layer made of a metal and an upper layer made of a metal different from the metal of the lower layer, forming a resist film having a predetermined pattern on the upper layer of the metal film, and patterning the metal film by etching the metal film using a first etching process of etching the upper layer using the resist film as a mask; immersing the resist film and the upper layer in a pretreatment liquid containing a nonionic surfactant after the first etching process; and etching the lower layer after the immersing process.

One advantage of the invention is suppressed side etching of the layers of the metal film, since a nonionic surfactant is made to cover the resist film and the upper layer by immersing the resist film and the upper layer in the pretreatment liquid containing the nonionic surfactant before etching the lower layer of the metal film. Accordingly, it is possible to form a metal pattern having almost vertical side surfaces and a desired width.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail. The invention provides a method of forming a metal pattern such as a wire on a substrate wherein the substrate is immersed in a pretreatment liquid containing a nonionic surfactant before performing an etching process. The method of forming a metal pattern according to an embodiment of the invention will be described with reference to FIGS. 1A to 1F. FIGS. 1A to 1F are sectional views schematically illustrating the method of forming a metal pattern according to an embodiment of the invention.

Figure 1A:
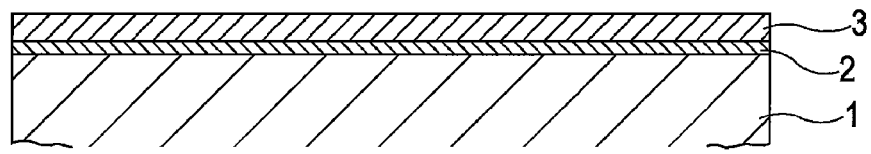
FIG. 1 is a sectional view schematically illustrating a method of forming a metal pattern according to an embodiment of the invention.
Figure 1B:
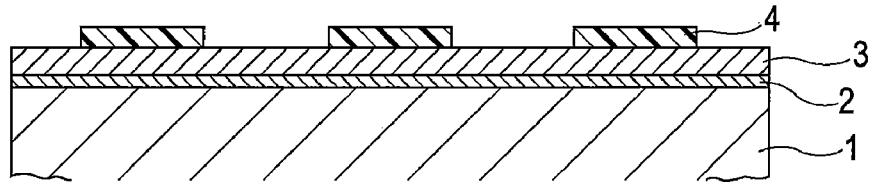

First, as shown in FIG. 1A, a metal film including a lower layer 2 made of a metal and an upper layer 3 made of a metal different from the lower layer 2 is formed on a substrate 1 using a metal film form forming process such sputtering. Next, as shown in FIG. 1B, a resist film 4 having a predetermined pattern is formed on the upper layer 3 using a resist film forming process such as photolithography.

Figure 1C:
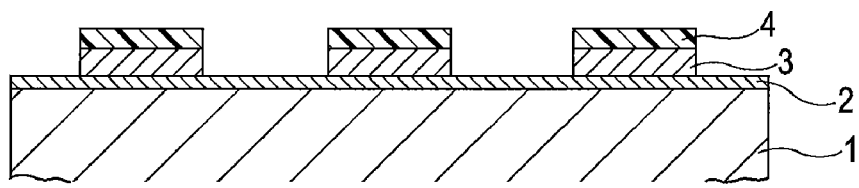
Figure 1D:
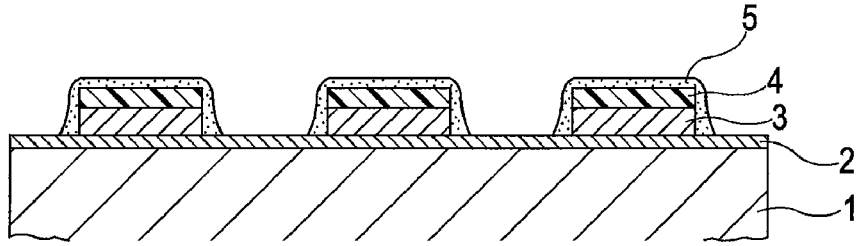
Figure 1E:
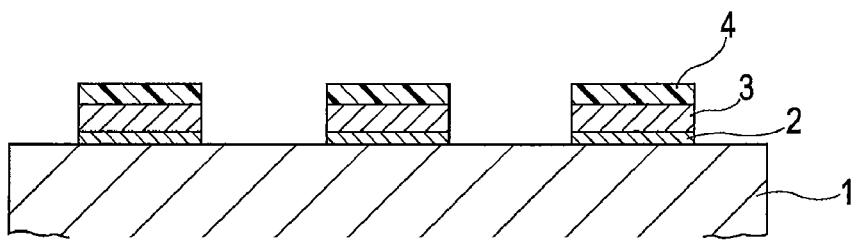
Figure 1F:
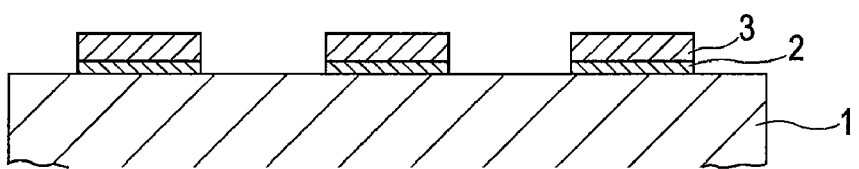

The metal film is patterned using a patterning process whereby the metal film comprised of a lower layer 2 and a upper layer 3 is etched using the resist film 4 as a mask. Specifically, as shown in FIG. 1C, by wet-etching the upper layer 3 using the resist film 4 as a mask, the upper layer 3 is created with the same width as the resist film 4. Next, the resist film 4 and the upper layer 3 are immersed in a pretreatment liquid containing a nonionic surfactant. As shown in FIG. 1D, the side surfaces of the resist film 4 and the upper layer 3 are covered with the nonionic surfactant 5 during this immersing process. As shown in FIG. 1E, by etching the lower layer 2 after the immersing process, the lower layer 2 is created with the same width as the resist film 4. Finally, as shown in FIG. 1F, the metal pattern is formed by peeling off the resist film 4.

In this way, by immersing the resist film 4 and the upper layer 3 in the pretreatment liquid containing the nonionic surfactant before etching the lower layer 2, the nonionic surfactant 5 serves as a protective film, thereby suppressing side etching. As a result, the side surface of the obtained metal pattern is almost vertical, thereby forming a metal pattern having the same width as the resist film 4.

Here, as shown in FIGS. 1A to 1F, when the metal film having a laminated structure of two metal films different from each other is etched, an electrical corrosion reaction is caused at the time of etching the lower layer of the metal film due to a difference in potential between the different metals. Accordingly, the metal having a lower potential is easily subjected to side etching and thus the side surface of the obtained metal pattern may become tapered. However, according to the present invention, the substrate is immersed in the pretreatment liquid containing the nonionic surfactant before the second etching process, that is, before etching of the lower layer. Thus, it is possible to suppress side etching due to the nonionic surfactant covering the side surface and to form a metal pattern having a vertical side surface and the same width as the resist film. Furthermore, in situations where the metal pattern has a large difference in potential, that is, a large difference in electric resistance, between the metal of the lower layer 2 and the metal of the upper layer 3, there is an increased chance of side etching due to the electrical corrosion reaction, and the method of forming a metal pattern to the invention is particularly effective.

In traditional etching processes, when the resist film 4 is immersed in the etchant during the second etching process, the resist film 4 may be peeled off from the metal film and the etching may advance laterally from the ends of the resist film 4. However, in the present invention, since the side surfaces of the resist film 4 and the upper layer 3 are covered with the nonionic surfactant 5 created by immersing the resist film 4 and the upper layer 3 in the solution containing the nonionic surfactant as pretreatment of the second etching process, it is possible to suppress the resist film 4 from being peeled off from the upper layer 3. As a result, since the lateral etching from the ends of the resist film 4 is suppressed, it is possible to form a metal pattern having a width equal to that of the resist film 4, and the side surface of the obtained metal pattern is almost vertical.

Thus, according to the method of forming a metal pattern according to the invention, the metal pattern may have a width equal to the resist pattern and it is possible to provide a metal pattern having a desired shape. Furthermore, the present invention provides high precision metal patterns even in situations where it is generally difficult to etch patterns, such as circumstances where the metal patterns are formed in an uneven portion of the substrate or patterns requiring a special shape such as a wedge shape or varying thickness. In addition, since side etching is suppressed, close adhesion between the metal pattern and the substrate is enhanced, preventing the metal pattern from peeling off the substrate. In addition, it is also possible to prevent the electrical corrosion reactions that may result from residual etchant remaining in areas subjected to side etching after the etching process.

Although the method of forming a two-layered metal pattern including two different metals has been described above, the metal pattern formed using the invention is not limited to the two-layered structure, and a metal pattern having a multilayered structure of three or more layers may be formed using the methods described in the invention.

The pretreatment liquid should contain the nonionic surfactant. An example of the nonionic surfactant can include polyoxyethylene lauryl ether, polyoxyethylene nonylphenyl ether, or alcohol. Such nonionic surfactants may be used alone or in a combination of two or more.

The concentration of the nonionic surfactant contained in the pretreatment liquid is preferably 10 ppm or more. When the concentration is less than 10 ppm, side etching may not be as effectively suppressed as with the higher concentrations. An example of an effective concentration is in the range of 10 ppm to 5%.

When an acid is used as the etchant in the second etching process subsequent to the immersing process, the surfactant is slowly decomposed. Accordingly, when the concentration of the nonionic surfactant is small, the nonionic surfactant is quickly decomposed when it comes into contact with the etchant and thus does not serve as a protective layer. Therefore, when an acid or similar solution capable of decomposing the nonionic surfactant is used as an etchant, the concentration of the nonionic surfactant in the pretreatment liquid is preferably 3% or more.

When the thickness of the metal film is relatively large, or 500 nm or more, a longer time is required for the etching process. Accordingly, it is preferable that the concentration of the nonionic surfactant is enhanced, for example, up to 3% or more, so that the protective layer formed by the nonionic surfactant will remain in tact until the end of the etching process. In order to minimize the treatment of waste liquid and the cost of the nonionic surfactant contained in the pretreatment liquid, the amount ideal amount of nonionic surfactant is the amount can be completely decomposed in the etching process. Accordingly, the preferred concentration of the nonionic surfactant in each system will be determined in accordance with the composition of the etchant, the etching speed, and the thickness of the metal film to be etched.

In traditional methods of forming metal patterns, the etching process is performed for a shortened time in order to minimize the effects of side etching. According to the present invention, however, since side etching is suppressed by immersing the substrate in the pretreatment liquid containing the nonionic surfactant, the etching time can be elongated. For example, the etching time may be 1.5 to 2 times the etching time typically used when the immersing process using the pretreatment liquid is not used. Accordingly, in the method of forming a metal pattern according to the invention, no etching residue remains as a result of the longer etching period meaning that there is no problem with foreign substances. In situations where the grain size of the metal film is large and the etching speed of the metal film is small, it is possible to form a metal pattern having an almost vertical side surface with a desired thickness.

It is preferable that the pretreatment liquid is water soluble. Alternatively, when an organic solvent is used as the solvent, a waste liquid is created at the time of treating the used pretreatment liquid as a waste liquid, requiring additional environmental and waste concerns.

While the temperature of the pretreatment liquid is not particularly limited, it is preferably in the same temperature range as the etchant used in the second etching process, that is, in the range of $\pm 5°$ C. of the temperature of the pretreatment liquid. When the difference in temperature between the etchant and the pretreatment liquid is too large, there is a reduced suppression of side etching. Thus, side etching can be most effectively be suppressed when the temperature of the etchant is equal to the temperature of the pretreatment liquid. The period of time for which the substrate is immersed in the pretreatment liquid is not particularly limited and may be 5 minutes or more.

The etchant of the second etching process is not particularly limited so long as it is capable of etching the lower layer. For example, an aqueous solution of pH4 or less can be used as the etchant.

A noble metal can be used as the metal comprising the upper layer 3 and a metal other than a noble metal can be used as the metal comprising the lower layer 2. For example, the noble metal can include gold (Au) and platinum (Pt) and the metal other than the noble metal used for the lower layer 2 can include Nichrome (NiCr), nickel (Ni), tungsten (W), and tantalum (Ta). Generally, when a metal pattern including a noble metal layer and a layer composed of a metal other than the noble metal is created, side etching can easily occur due to the large difference in electrical resistance, that is, the large difference in potential. However, in the invention, it is possible to suppress side etching to form the metal pattern.

The resist material of the resist film 4 may be of a positive type or of a negative type. For example, the resist material can include an alkali soluble resin such as a novolac resin. Since the alkali soluble resin enables formation of a high-resolution resist, it is possible to form a fine metal pattern on a substrate. While the alkali soluble resin has a tendency to be easily peeled off in the course of the etching process, since the substrate is immersed in a solution containing the nonionic surfactant as pretreatment of the etching process in the invention, the nonionic surfactant 5 covers the side surfaces of the interface between the resist film 4 and the upper layer 3 in order to serve as a protective film. Accordingly, it is possible to suppress the alkali soluble resin from being peeled off.

The metal film forming process, the resist film forming process, and the first etching process are not particularly limited and may employ a variety of conditions generally used in the art. A process of washing the etched area or the like with water may be performed after the first etching process. By immersing the resist film in the pretreatment liquid before the first etching process, it is possible to prevent the resist film from being peeled off in the first etching process. The kinds of the substrate 1 on which the metal pattern is formed are not particularly limited.

As described above, according to the invention, it is possible to provide a metal pattern having a desired shape by suppressing side etching. Accordingly, when wires of integrated circuits or the like are formed using the metal pattern forming method according to the invention, it is possible to make the width of the metal pattern smaller and thus to increase the degree of integration of the integrated circuits. Since wires having an almost vertical side surface can be obtained, abnormal leakage due to a defective shape can be prevented.

The invention will be described in more detail with reference to examples of the invention.

EXAMPLES

A metal pattern including an NiCr layer with a thickness of 50 nm formed on a silicon substrate and an Au layer with a thickness of 100 nm formed on the NiCr layer was formed using the metal pattern forming method according to the invention. Specifically, a metal film of NiCr and Au was formed on the silicon substrate by using a sputtering method. A resist film having a predetermined pattern and using an alkali soluble resin as a resist material was formed on the metal film, and then the Au layer was etched using the resist film as a mask. Thereafter, the resist film and the Au layer were immersed at 23° C. for 5 minutes in a pretreatment liquid in which 3% of a nonionic surfactant (polyoxyethylene lauryl ether) was dissolved in water. As a result, a film of the nonionic surfactant was formed from the top surface of the resist film to the side surface of the Au layer. Next, the NiCr layer was etched using the resist film as a mask with a nitric acid having a concentration of 40% and a temperature of 23° C. Thereafter, a metal pattern was obtained by peeling off the resist film. There was a difference (side etching width) of about 0.15 μm between the width of the resist film and the width of the obtained metal pattern, which means that little side etching occurred, and the obtained metal pattern had a vertical side surface and a width almost equal to the width of the resist film. Additionally, the resist film did not peel off the metal film during the etching process. In comparison, a metal pattern created using the same processes except the process of immersing the sample in the pretreatment liquid containing a nonionic surfactant resulted in a side etching width of 3 to 4 μm and a tapered side surface. Thus, it could be seen that side etching was suppressed by the nonionic surfactant.

What is claimed is:

1. A method of forming a metal pattern, the method comprising:
    forming a metal film with a lower and upper layer, with the lower layer and upper layer each made of a metal, the upper layer made from a metal different than the lower layer;
    forming a resist film on the upper layer according to a predetermined pattern; and
    forming a patterned metal film, the process of forming the patterned metal film, comprising:
        etching the upper layer using a first etchant and the resist film as a mask;
        immersing the resist film and the upper layer in a pretreatment liquid containing a nonionic surfactant following etching the upper layer using the first etchant, the nonionic surfactant in the pretreatment liquid forming a nonionic surfactant film over the upper layer and the resist film;
        immersing the metal film, resist film, and nonionic surfactant film in a second etchant; and
        etching the lower layer using a second etchant and the resist film as a mask,
        wherein the nonionic surfactant film formed over the upper layer and the resist film prevents the second etchant from etching the upper layer.

2. The method of forming a metal pattern according to claim 1, wherein immersing the resist film and the upper layer comprises immersing the resist film and upper layer in a pretreatment liquid having a temperature in the range of ±5° C. of the temperature of the second etchant.

3. The method of forming a metal pattern according to claim 1, wherein the concentration of the nonionic surfactant in the pretreatment liquid is 10 parts per million or more.

4. The method of forming a metal pattern according to claim 1, wherein the upper layer is made of a noble metal and the lower layer is made of a metal other than a noble metal.

5. The method of forming a metal pattern according to claim 4, wherein the upper layer is made of one of gold (Au) or platinum (Pt) and the lower layer is made of one of Nichrome (NiCr), nickel (Ni), tungsten (W), or tantalum (Ta).

6. The method of forming a metal pattern according to claim 1, wherein the second etchant is an aqueous solution having a pH value of 4 or less.

7. A method of forming a patterned metal film comprised of an lower and upper layer, with the lower layer and upper layer each made of a metal, and the upper layer comprised of a metal different than the lower level, the method comprising:
    forming a resist film from a alkali-soluble resin material on the upper layer according to a predetermined pattern;
    etching the upper layer using an etchant and the resist film as a mask;
    immersing the resist film and the upper layer in a pretreatment liquid containing a nonionic surfactant, in order to form a nonionic surfactant film over the upper layer and the resist film;
    immersing the metal film, resist film, and nonionic surfactant film in a second etchant; and
    etching the lower layer using the second etchant and the resist film as a mask,
    wherein the nonionic surfactant film formed over the upper layer and the resist film prevents the second etchant from etching the upper layer.

8. The method of forming a metal pattern according to claim 7, wherein immersing the resist film and the upper layer of the metal film comprises immersing the resist film and upper layer in a pretreatment liquid having a temperature in the range of ±5° C. of the temperature of the second etchant.

9. The method of forming a metal pattern according to claim 7, wherein the concentration of the nonionic surfactant in the pretreatment liquid is 10 parts per million or more.

10. The method of forming a metal pattern according to claim 7, wherein the upper layer of the metal film is made of a noble metal and the lower layer of the metal film is made of a metal other than a noble metal.

11. The method of forming a metal pattern according to claim 10, wherein the upper layer is made of one of gold (Au) or platinum (Pt) and the lower layer is made of one of Nichrome (NiCr), nickel (Ni), tungsten (W), or tantalum (Ta).

12. The method of forming a metal pattern according to claim 7, wherein the second etchant is an aqueous solution having a pH value of 4 or less.

* * * * *